US009495295B1

(12) United States Patent
Dutt et al.

(10) Patent No.: US 9,495,295 B1
(45) Date of Patent: Nov. 15, 2016

(54) PHOTONICS-OPTIMIZED PROCESSOR SYSTEM

(71) Applicant: PhotonIC International Pte. Ltd., Singapore (SG)

(72) Inventors: Birendra Dutt, Westchester, CA (US); Douglas B. Boyle, Palo Alto, CA (US)

(73) Assignee: PHOTONIC INTERNATIONAL PTE. LTD., Singapore (SG)

( * ) Notice: Subject to any disclaimer, the term of this patent is extended or adjusted under 35 U.S.C. 154(b) by 0 days.

(21) Appl. No.: 14/822,778

(22) Filed: Aug. 10, 2015

Related U.S. Application Data

(60) Provisional application No. 62/151,924, filed on Apr. 23, 2015.

(51) Int. Cl.
| | | |
|---|---|---|
| G06F 12/08 | (2016.01) | |
| G11C 7/10 | (2006.01) | |
| G06F 15/78 | (2006.01) | |

(52) U.S. Cl.
CPC ....... *G06F 12/0842* (2013.01); *G06F 12/0817* (2013.01); *G06F 15/781* (2013.01); *G06F 15/7825* (2013.01); *G11C 7/1072* (2013.01); *G06F 2212/622* (2013.01); *G06F 2212/70* (2013.01)

(58) Field of Classification Search
CPC ........... G06F 12/0842; G06F 12/0817; G06F 15/781; G06F 15/7825; G11C 7/1072
USPC ....... 711/105, 130, 148, 154, 156, 205, 207, 711/216
See application file for complete search history.

(56) References Cited

U.S. PATENT DOCUMENTS

| | | | | |
|---|---|---|---|---|
| 5,359,208 A | * | 10/1994 | Katsuki ................ | G02B 6/4226 257/432 |
| 5,537,574 A | * | 7/1996 | Elko ........................ | G06F 9/52 700/5 |
| 5,895,487 A | * | 4/1999 | Boyd .................. | G06F 12/0817 711/122 |
| 8,064,739 B2 | * | 11/2011 | Binkert .................... | G02B 6/43 365/64 |
| 9,435,952 B2 | * | 9/2016 | Stephens ................ | G02B 6/136 |
| 9,442,254 B2 | * | 9/2016 | Pelley .................. | G02B 6/3584 |
| 2003/0028587 A1 | * | 2/2003 | Driscoll ................ | G06F 3/0601 709/203 |
| 2008/0093713 A1 | * | 4/2008 | Campbell ............ | G02B 6/4201 257/666 |

(Continued)

*Primary Examiner* — Stephen Elmore
(74) *Attorney, Agent, or Firm* — David R. Stevens; Stevens Law Group

(57) ABSTRACT

A photonics-optimized multi-processor system may include a plurality of processor chips, each of the processor chips comprising at least one input/output (I/O) component. The multi-processor system may also include first and second photonic components. The at least one I/O component of at least one of the processor chips may be configured to directly drive the first photonic component and receive a signal from the second photonic component. A total latency from any one of the processor chips to data at any global memory location may not be dominated by a round trip speed-of-light propagation delay. A number of the processor chips may be at least 10,000, and the processor chips may be packaged into a total volume of no more than 8 m³. A density of the processor chips may be greater than 1,000 chips per cubic meter.

16 Claims, 12 Drawing Sheets

(56) References Cited

U.S. PATENT DOCUMENTS

| | | | | |
|---|---|---|---|---|
| 2010/0293338 A1* | 11/2010 | Krishnaprasad | G06F 12/0813 | 711/136 |
| 2011/0258420 A1* | 10/2011 | Devadas | G06F 9/3824 | 712/225 |
| 2013/0268727 A1* | 10/2013 | Sohn | G11C 8/00 | 711/105 |
| 2014/0006705 A1* | 1/2014 | Yu | G11C 11/40607 | 711/106 |
| 2014/0153881 A1* | 6/2014 | Liff | G02B 6/4214 | 385/89 |
| 2014/0203175 A1* | 7/2014 | Kobrinsky | G02B 6/428 | 250/214.1 |
| 2014/0270621 A1* | 9/2014 | Dutt | G02B 6/43 | 385/11 |
| 2014/0270629 A1* | 9/2014 | Dutt | G02B 6/43 | 385/14 |
| 2014/0362425 A1* | 12/2014 | Stephens | G02B 6/3502 | 359/107 |
| 2014/0363119 A1* | 12/2014 | Stephens | G02B 6/136 | 385/14 |
| 2014/0363124 A1* | 12/2014 | Pelley | G02B 6/3502 | 385/16 |
| 2014/0363172 A1* | 12/2014 | Pelley | H04B 10/801 | 398/141 |
| 2015/0253511 A1* | 9/2015 | Pelley | G02B 6/3584 | 385/14 |
| 2016/0013865 A1* | 1/2016 | Dutt | H04B 10/516 | 398/139 |
| 2016/0117101 A1* | 4/2016 | Choi | G06F 3/061 | 711/103 |

* cited by examiner

Top View

Front View

PHOTONICS-OPTIMIZED PROCESSOR SYSTEM

CROSS-REFERENCE TO RELATED APPLICATIONS

This application claims the priority benefit of U.S. Provisional Patent Application No. 62/151,924, filed on Apr. 23, 2015. This application is also related to U.S. application Ser. No. 14/822,744, filed Aug. 10, 2015, U.S. application Ser. No. 14/822,752, filed Aug. 10, 2015, U.S. application Ser. No. 14/822,758, filed Aug. 10, 2015, and U.S. application Ser. No. 14/822,766, filed Aug. 10, 2015. All applications are incorporated herein by reference for all purposes.

TECHNICAL FIELD

The present disclosure generally relates to photonics and, in particular, to a photonics-optimized processor.

BACKGROUND

Unless otherwise indicated herein, approaches described in this section are not prior art to the claims listed below and are not admitted to be prior art by inclusion in this section.

Processor micro-architecture and performance are strong functions of the technology used for communication among chips in a multi-chip system. The "Von Neumann bottleneck" is the path between the central processing unit (CPU) and the memory. If the bandwidth of this path is less than the CPU requirements, performance will be negatively impacted. The performance will also be negatively impacted if latency exceeds the CPU requirements. In state-of-the-art parallel processing systems, each processor chip contains multiple processing elements, or cores, has links to other processor chips, and has links to one or more memory chips.

SUMMARY

The following summary is for illustrative purpose only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

In one aspect, a photonics-optimized multi-processor system may include a plurality of processor chips, each of the processor chips comprising at least one input/output (I/O) component. The multi-processor system may also include first and second photonic components. The at least one I/O component of at least one of the processor chips may be configured to directly drive the first photonic component and receive a signal from the second photonic component. A signal may be either analog or digital. One purpose of the optimization of the processor chip is to minimize the total latency from any one of the processor cores to data at any global memory location in a multi-chip system. Another purpose of the optimization is to increase bandwidth from any one of the processor cores to data at any global memory location in a multi-chip system. The optimization also seeks to maximize the performance of a processor chip by providing enough memory bandwidth for the maximum number of cores and/or other processing elements on a processor chip. The optimization further seeks to maximize performance for a given set of constraints. Full optimization of a POP for a supercomputer must be accompanied by optimization of the system design to minimize the length of the IPI physical media, such as optical fibers. A measure of the success of the optimization may be that the total latency from any one of the processor chips to data at any global memory location may not be dominated by a round trip speed-of-light propagation delay. Success may be achieved for a supercomputer configuration if a number of the processor chips may be at least 10,000, and the processor chips, along with off-chip memory devices, may be packaged into a total volume of no more than 8 $m^3$. A density of the processor chips may be greater than 1,000 chips per cubic meter.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

Overview

Figure 1:
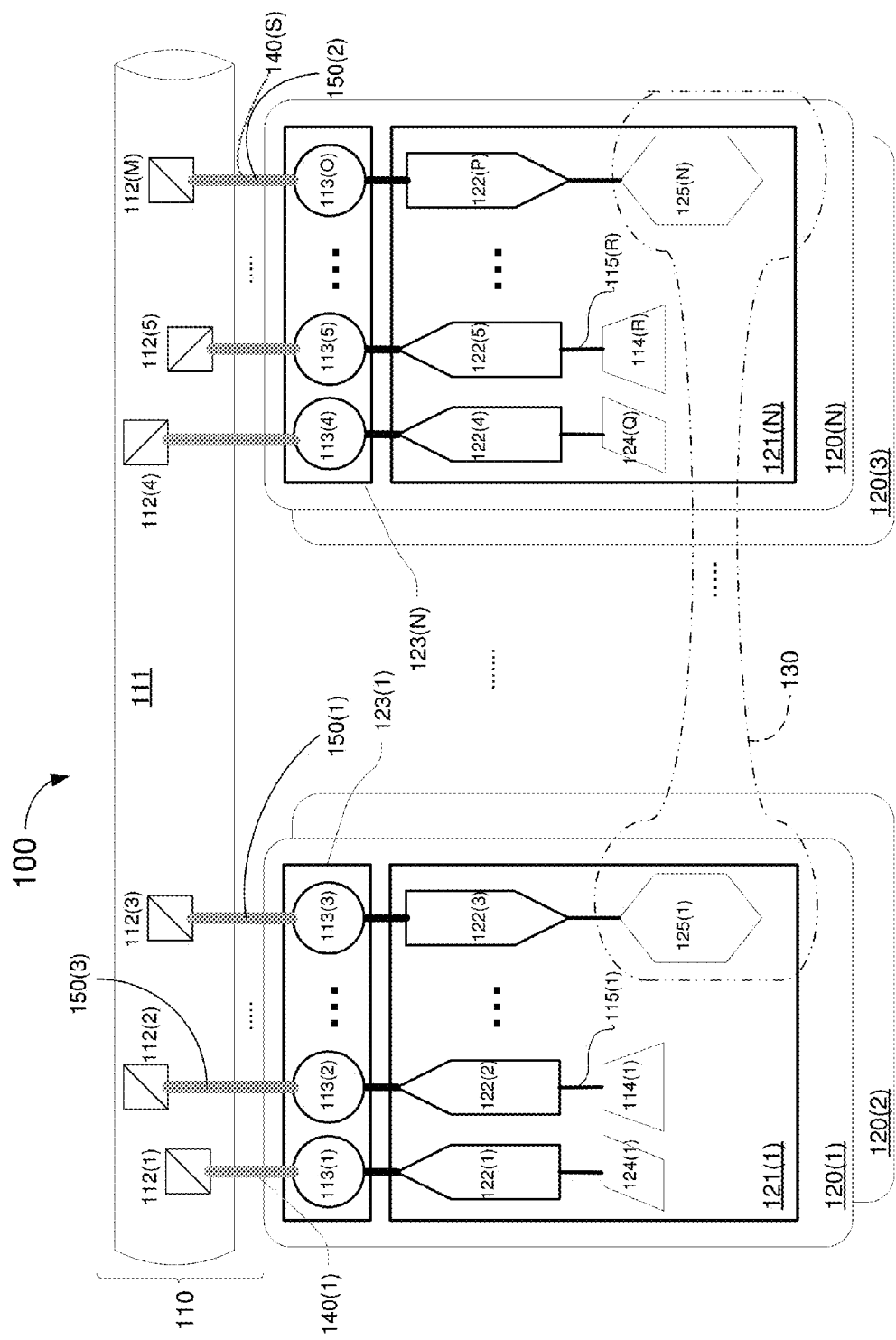
FIG. 1 is a schematic diagram of a photonics-optimized multi-processor system in accordance with the present disclosure.

In general a large parallel system tends to have multiple processor chips. Each processor chip may have one or more types of processing elements (herein interchangeably referred to as "cores"), and each core needs to communicate with all of the other cores in the system. Each processor chip controls access to its local memory, either on-chip, e.g., cache, or off-chip, e.g., dynamic random access memory (DRAM). An on-chip interconnect (OCI) provides communication among cores, caches, interfaces to other processor chips, memory controllers, I/O, network controllers, and other devices on the same chip. The OCI may comprise links, a central crossbar switch, a network of switches, or other mechanisms. Cores often need to access remote memory, e.g., memory which is local to another processor chip. Thus, the Von Neumann processor-memory bottleneck also includes the paths among the processor chips, also known as the inter-processor interconnect (IPI). The bandwidth of the interface between the processor chip and the IPI is known as the injection bandwidth.

Over time the requirements of a CPU may change according to the application software which is being executed. Computation-intensive applications primarily use internal registers of the CPU to store inputs and results of computations. When the CPU issues fetch instructions to get the inputs from memory and issues store instructions to put the results back to memory, the data is usually found in the cache. In this case, the bandwidth and latency of the path to the off-chip DRAM memory has comparatively little impact on performance. However, for data-intensive applications, the CPU usually needs to issue fetch instructions to get inputs from memory and issue store instructions to put the results back to memory. The data is usually not in the cache and an off-chip DRAM memory transaction is required. Accordingly, the processor performance decreases because the latency in accessing the memory causes the CPU to wait for the data inputs. Limited memory bandwidth reduces performance because the CPU must slow down until it is issuing memory transactions at the same rate that the memory can process the instructions.

In certain applications, substantially all of the cores of a processor chip may be accessing remote memory, which implies that substantially all of the transactions accessing local memory originate from another processor chip. In this case, assuming uniform traffic, the injection bandwidth to the IPI for each processor chip must be the total of the aggregate bandwidth to memory of its cores plus the bandwidth of the chip to local memory to avoid congestion. The injection bandwidth to the IPI must be higher to avoid congestion if the traffic has 'hot spots' (higher than average traffic to and/or from a subset of the processor chips). Congestion increases latency of the memory accesses.

Processor micro-architectures are designed and carefully optimized to achieve a particular level of performance with a minimum amount of resources to minimize cost. The system application defines the environment and application software characteristics, which, in turn, define the relative importance of parameters such as performance, memory, cost, size, weight, and power. These parameters are very different for various implementations such as, for example, cellphones and supercomputers.

Current processors are copper-optimized. The corresponding microarchitecture is typically constrained by the number of pins on the package and the characteristics of the connections to other chips in the system. Signals being transmitted through copper connections can be attenuated to the point that they cannot be received. Attenuation is a function of frequency of the signal and the length of the connection. Thus, for a given length, the data rate is limited and the bandwidth on and off the chip is limited by the number of pins.

The number of pins on a chip package is limited by cost. For instance, a processor chip of a cellphone tends to have strict cost constraints and may have about 750 pins. A processor chip of a server may have about 2,000 pins. A processor chip of a mainframe, also known as an "enterprise system", may have about 9,000 pins. Typically, about two-thirds of the package pins are used to provide power and ground connections to the chip. The remaining one-third of the pins are used for signal connections. The cost of the processor chip also increases with the number of pins since the areas of the input/output (I/O) driver and electrostatic discharge (ESD) protection circuits tend to be large.

The number of pins required by the microarchitecture is a function of the system design and performance requirements. For instance, a cellphone may have only one application processor chip, and so it may not require pins for the IPI. A server typically has two processor chips and may only need a relatively small number of pins for the IPI and the off-chip DRAM memory. The number of pins for the IPI increases with the number of processor chips in the system if the processor chip contains the IPI switches, which is often done to reduce latency. Latency increases with the interconnect diameter (number of "hops" between processors). More ports (higher radix) and the associated pins to the IPI may be added to reduce the diameter. However, this reduces the number of pins available for high memory bandwidth. A mainframe may have a large number of pins dedicated to memory bandwidth. The number of ports to the IPI is limited, so scaling may still be limited, in spite of the increase in total pins.

In view of the above, a photonics-optimized processor (POP) system in accordance of the present disclosure is designed to use integrated silicon photonics (ISP) instead of copper for communication among chips. ISP can communicate information to and from a processor chip using dramatically less power and space than the copper-based communication technology which is in use presently. Alternatively the improvements in power and space can be used to dramatically increase the bandwidth. By using ISP, a computer architect can design a processor with a new microarchitecture which has dramatically higher performance and requires less energy and lower costs to achieve a given level of performance for data-intensive applications.

Processor with ISP

The system and microarchitecture design spaces change dramatically when the cost of communication among chips drops by ten times along each of a number of dimensions. An ISP-based POP chip in accordance with the present disclosure may be in the same cost range as today's copper-based server chip, and can have ten to twenty times more bandwidth to memory and perform data-intensive calculations at 90% efficiency instead of 5%. Embodiments of a POP chip of the present disclosure can also have an IPI with the "glueless" scalability (not requiring external chips for scaling), bandwidth, and low latency required to build a datacenter, mainframe, or supercomputer with thousands of processor chips. All of the active components of the IPI may be on the POP chip, so only passive waveguides and/or fibers are needed to build a high performance computer system. Advantageously, ISP may replace all of the signal pins, leaving just the power and ground pins. As a printed circuit board (PCB) in a system according to the present disclosure is merely used to deliver power, the PCB in a system according to the present disclosure becomes much simpler and cheaper compared to conventional PCBs. The size of a supercomputer in which embodiments of the present disclosure are implemented may be reduced fifty times, and so latency due to the speed of light may be reduced by eight times. This reduction is important for support of memory models such as shared global memory. For example, a shared memory model may require that the total latency budget for global memory accesses is less than 100 ns. The roundtrip propagation delay in a copper-based supercomputer can be greater than 300 ns, which would significantly reduce performance. In accordance with this disclosure, over 10,000 processor chips may be packaged into a total volume of no more than 8 cubic meters ($m^3$). The maximum total path length between processor chips may be 3.6 m and the maximum roundtrip propagation delay may be 39 ns. The remaining 61 ns of the latency budget may be allocated to the logic in the path. A density of the processor chips may be greater than 1,000 chips per cubic meter.

The ISP-based POP server chip in accordance with the present disclosure may also support a number of memory models which simplify software development for datacenters, mainframes, and supercomputers.

However, to achieve these capabilities, the architectures need to be optimized to a new set of constraints. Simply replacing the copper I/O on a legacy chip may provide modest improvements at best.

Photonics-Optimized Processor

The architecture of a photonics-optimized processor, or POP, and a POP-based system in accordance with the present disclosure can deliver capabilities which are not possible with copper. The optimization starts at the system level.

The system design may optimize the POP and the components outside of the POP. This includes, but is not limited to, the IPI, the multi-level memory system from rotating to solid state disk (SSD) to high-speed memory, e.g., DRAM, using a type of DRAM which provides higher bandwidth and/or lower latency, packaging, electrical power delivery, heat removal, and connectivity to components such as networks, sensors, displays, and actuators. Many of the characteristics of these system level components affect the parameters for optimizing the POP chip, so it is important to optimize them together to achieve an optimal design.

Optimizing the POP includes, but is not limited to, adding circuits which directly connect to photonic components, reducing wafer fabrication costs by eliminating CMOS process steps for building high voltage I/O transistors, increasing the number of cores, increasing the bandwidth of the OCI, increasing the memory bandwidth, decreasing latency of references to local memory and to global memory, increasing the number of address bits (in buses, registers, CPU, MMU), increasing the maximum page size, implementing a cache-coherence system which is scalable to thousands or millions of processor chips, increasing the radix and injection bandwidth of the on-chip IPI switch, and reducing the number of buffers in the IPI switch because the lengths of the IPI physical media have been reduced.

A POP can be a general-purpose processor, a special-purpose processor, or a hybrid (heterogeneous processor). A core in a multicore POP may be a general-purpose processor or a special-purpose processor. A multicore POP comprising two or more types of cores is a heterogeneous POP. A general-purpose processor generally has an instruction set architecture (ISA) and microarchitecture designed for balanced performance across a wide range of applications such as, for example, ARM, x86, Power, scalable processor architecture (SPARC) and Microprocessor Without Interlocking Pipe Stages (MIPS) A special-purpose processor generally has an ISA and microarchitecture designed for high performance in certain applications, but low performance in others. Applications suitable for special-purpose processors may include, for example, digital signal processing (DSP), network processors and graphics processing units (GPU). Specialized processors may also be found in interfaces to sensors or actuators, for example. Very simple types of special-purpose processors may include DMA engines for transferring large blocks of data.

A POP which uses wavelength-division multiplexing (WDM) can save energy by replacing a serializer/deserializer (SerDes) with equalization and clock data recovery (CDR) circuits with a parallel-to-serial converter and a forwarded clock at a substantial savings of energy and chip area. The low attenuation of the photonic path dramatically reduces the jitter. Skew is all but eliminated by sending the data and clock on different channels (wavelengths) in the same waveguide/fiber. Reduced jitter and/or skew allow this efficient clock forwarding technique can be used at much higher data rates in ISP links than in the usual copper circuits.

Example Implementations

Select example implementations in accordance with the present disclosure are described below. It is noteworthy that some or all features described below may be embodied in one single multi-processor system. That is, features of multiple example implementations described below may be embodied in the same multi-processor system. In other words, a multi-processor system in accordance with the present disclosure may include some or all of the features described below.

FIG. 1 illustrates a photonics-optimized multi-processor system 100 in accordance with the present disclosure. Referring to FIG. 1, a multi-processor system 100 may include a plurality of tiles of photonics-optimized processors. Each of the photonics-optimized processor tiles (or, for short, photonics-optimized processors) 120(1)-120(N) may include a respective one of a plurality of processor chips 121(1)-121(N). Each of the processors 120(1)-120(N) may also include a respective one of a plurality of photonic wafers or portions of photonic wafers 123(1)-123(N). Each of the processor chips 121(1)-121(N) may include one or more I/O components, such as I/O components 122(1)-122(P) shown in FIG. 1. Each of the I/O components 122(1)-122(P) may be configured to transmit or receive information, data and/or signals. Each of the photonic wafers 123(1)-123(N) may include a plurality of photonic components, such as photonic components 113(1)-113(O) shown in FIG. 1. For each of the processors 121(1)-121(N), each of the I/O components 122(1)-122(P) may be connected with one of the photonic components of the processor. The connection may be minimized by placing the respective photonic wafer in close proximity of the respective processor chip. For example, in the example shown in FIG. 1, photonic wafer 123(1) may be disposed directly above processor chip 121(1), and a short connection, such as 30 μm of vertical copper pillars, may be used to connect I/O component 122(1) and photonic component 113(1) so as to minimize the physical distance of the connection therebetween. Similarly, each of the I/O components of the respective processor chip may be connected to circuits of the processor chip using short connections so as to minimize the distance between the I/O component and the circuits, while the circuits serve as a source or sink of the information, data and/or signals transmitted or received. For example, in the example shown in FIG. 1, the physical distance of the connection between I/O component 122(1) and data 124(1) may be minimized by using a short connection.

Processors 120(1)-120(N) may be interconnected with one another via an inter-processor interconnect (IPI) 110 such that the processors 120(1)-120(N) may communicate with one another. IPI 110 may include a waveguide assembly, and the waveguide assembly may include a plurality of optical fibers and/or other types of waveguide. IPI 110 may also include one of more fibers configured for WDM, as well as couplers each of which is disposed on an optical path of the one or more fibers. The couplers are used to connect the fibers to the waveguide assembly. The fibers, configured for WDM, may be single-mode fibers, and the couplers may be either a grating coupler or an edge coupler. Each of the processors 120(1)-120(N) may accordingly connect to IPI 110 with one or more of its respective photonic components connected to the fibers configured for WDM. In the example shown in FIG. 1, IPI 110 includes a waveguide assembly 111, fibers 140(1)-140(S) configured for WDM, and a plurality of couplers 112(1)-112(M) each disposed on an optical path of the fibers 140(1)-140(S). Photonic components 113(1)-113(O) are connected to IPI 110 through the fibers 140(1)-140(S), establishing the interconnection between the processors 120(1)-120(N). Communications among the processors 120(1)-120(N) can thus be realized. For example, a communication path between processors 120(1) and 120(N) may be formed by a series of connections, starting from photonic component 113(1) to coupler 112(1) through fiber 140(1), then from coupler 112(1) to coupler 112(M) through waveguide assembly 111, and then from coupler 112(M) to photonic component 113(O) through the fiber 140(S). The I/O components 122(1)-122(P) may be directly connected to photonic components 113(1)-113(O) to communicate with, e.g., transmit information, data and/or signals to and receive information, data and/or signals from, couplers 112(1)-112(M) of IPI 110. Some or all of the I/O components 122(1)-122(P) may be configured or connected to transmit data. In the example shown in FIG. 1, I/O components 122(1) of processor chip 121(1) and 122(4) of processor chip 121(N) are configured to transmit data 124(1) and 124(Q), respectively, of a plurality of data 124(1)-124(Q). Some or all of the I/O components 122(1)-122(P) may be connected to a forwarded clock device. In the example shown in FIG. 1, I/O components 122(2) of processor chip 121(1) and 122(5) of processor chip 121(N) are connected to forwarded clock devices 114(1) and 114(R), respectively, of a plurality of forwarded clock devices 114(1)-114(R). The forwarded clock devices 114(1)-114(R) may be configured to generate and provide forwarded clock signals 115(1)-115(R).

Each of the processor chips 121(1)-121(N) may also include a respective one of a plurality of internal clocks 125(1)-125(N), each of which is connected to a respective I/O component. In the example shown in FIG. 1, internal clock 125(1) is connected to I/O component 122(3), and internal clock 125(N) is connected to I/O component 122(P). Each of the internal clocks 125(1)-125(N) may serve as a master clock for the respective processor chip. For example, internal clock 125(1) may serve as a master clock for processor chip 121(1). Also, each of the internal clocks 125(1)-125(N) may be controlled by phase and/or frequency information, received by the respective I/O component, from the one or more external sources. In the example shown in FIG. 1, internal clock 125(1) is controlled by phase and/or frequency information 150(1) received by I/O component 122(3), and internal clock 125(N) is controlled by phase and/or frequency information 150(2) received by I/O component 122(P). In addition, for some or all of the processor chips 121(1)-121(N), the respective internal clock may be connected to the respective forwarded clock device. In the example shown in FIG. 1, internal clocks 125(1) and 125(N) are connected to forwarded clock devices 114(1) and 114(R), respectively.

Multi-processor system 100 may operate isochronously. The isochronous operation may be achieved by means of a distributed phase locked loop 130. One or more of the internal clocks 125(1)-125(N) may participate in the distributed phase locked loop 130 among two or more of the processor chips 121(1)-121(N) of multi-processor system 100. Each of the internal clocks that participate in the distributed phase locked loop may export a clock signal, through the IPI 110, to one or more others of the participating internal clocks, using the forwarded clock device connected to the internal clock. In the example shown in FIG. 1, a participating internal clock 125(1) of processor tile 120(1) may export the clock signal (represented by phase and/or frequency information 150(3)) to IPI 110 through forwarded clock device 114(1), I/O component 122(2) and photonic component 113(2). On the other end of the IPI 110, another participating internal clock 125(N) of processor tile 120(N) may receive the clock signal exported by internal clock 125(1) (represented by phase and/or frequency information 150(2)) through photonic component 113(O) and I/O component 122(P). Each of the internal clocks 125(1)-125(N) that participate in the distributed phase locked loop may receive phase and/or frequency information exported by one or more others of the participating internal clocks. Each of the participating internal clocks adjusts its own clock signal accordingly and simultaneously for a same period of time while the exporting and receiving of the clock signals is taking place, until the clock signals of all participating internal clocks 125(1)-125(N) converge to a same frequency, thereby achieving the isochronous operation. It is noted that, for each of the participating internal clocks, exporting the clock signal by using the connected forwarded clock device that is otherwise used for normal data transmission has an advantage of realizing the distributed phase locked loop without the need of a dedicated I/O component, simplifying the system.

Figure 2:
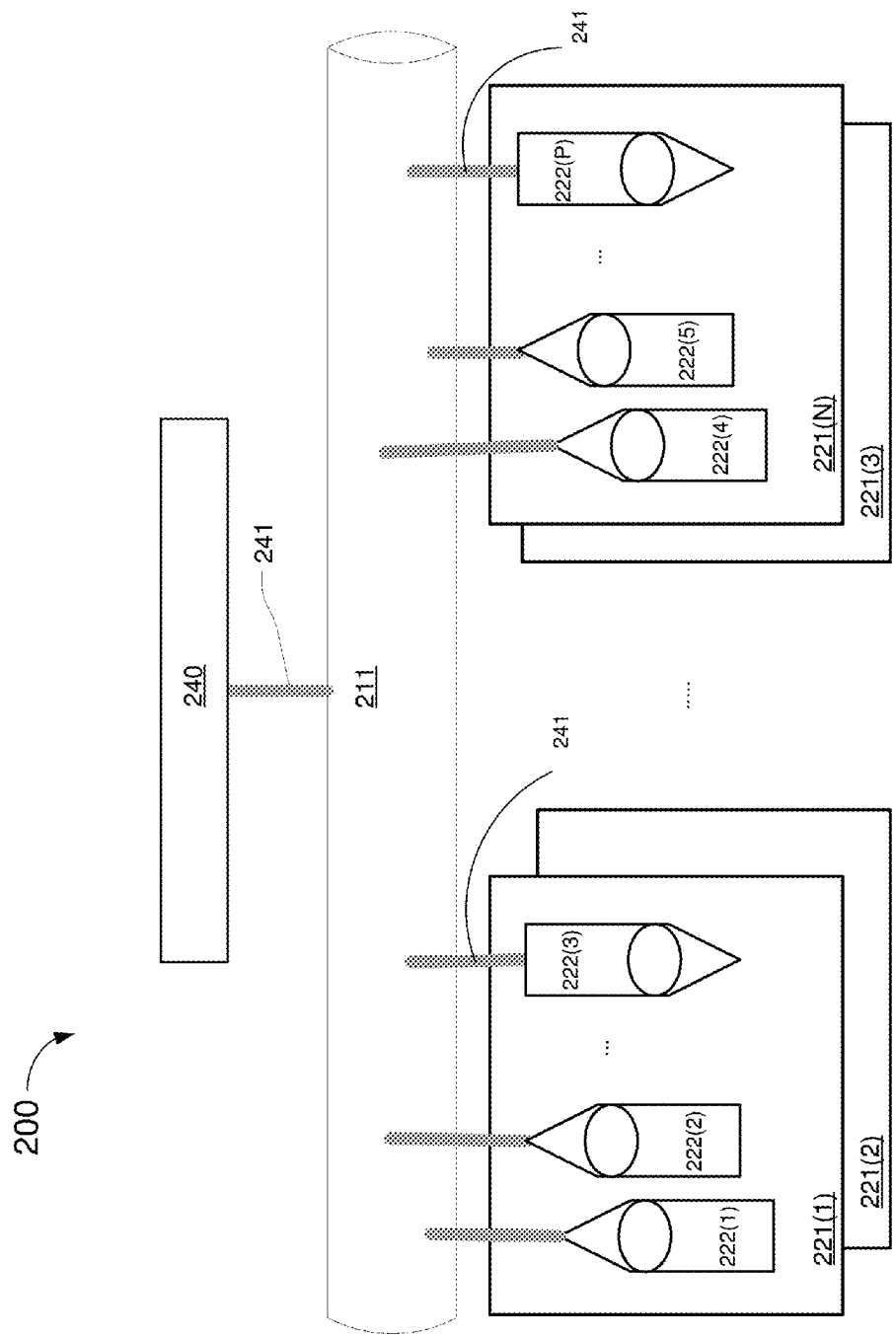
FIG. 2 is a schematic diagram of another photonics-optimized multi-processor system in accordance with the present disclosure.

FIG. 2 illustrates a photonics-optimized multi-processor system 200 in accordance with the present disclosure. Referring to FIG. 2, multi-processor system 200 may include a plurality of photonics-optimized processor chips 221(1)-221(N). Each of the processor chips 221(1)-221(N) may include one or more I/O components, such as I/O components 222(1)-222(P) shown in FIG. 2. Each of the I/O components 222(1)-222(P) may be configured to transmit or receive information, data and/or signals. Multi-processor system 200 may also include a waveguide assembly 211 which is photonically connected to the I/O components 222(1)-222(P) of the processor chips 221(1)-221(N).

Multi-processor system 200 may further include a central clock device 240 that generates a central clock signal 241. At least one of the I/O components 222(1)-222(P) may be connected to directly receive the central clock signal 241 which is distributed photonically (via photonic components of multi-processor system 200) to one or more of processor chips 221(1)-221(N). The central clock signal 241 may be configured to allow at least one of the processor chips 221(1)-221(N) to clock isochronously with one or more others of the processor chips 221(1)-221(N).

Multi-processor system 100 may achieve isochronous operation by means of a hybrid of centralized and distributed techniques.

Figure 3:
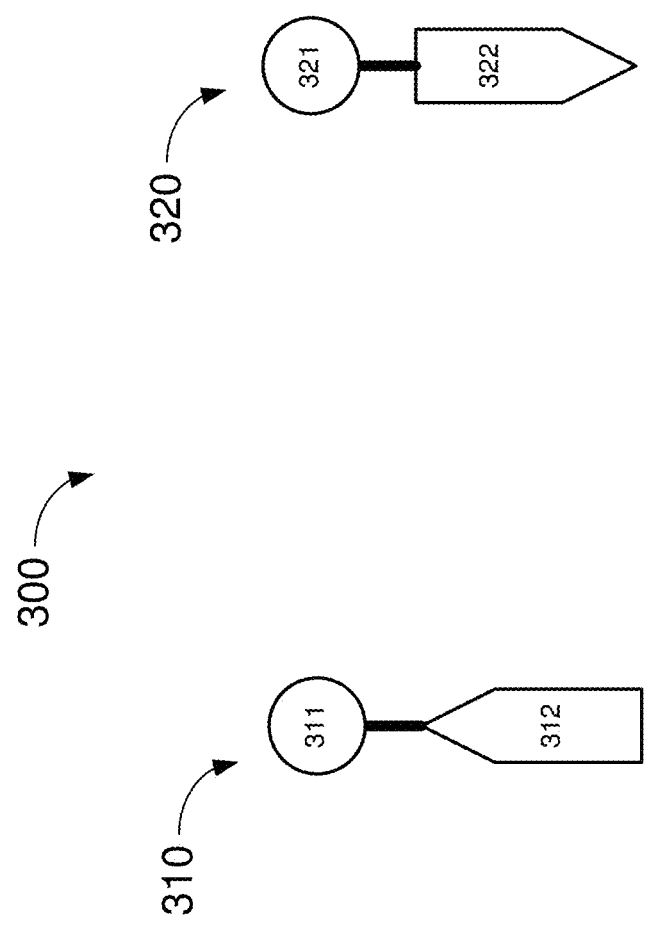
FIG. 3 is a schematic diagram of still another photonics-optimized multi-processor system in accordance with the present disclosure.

FIG. 3 illustrates a photonics-optimized multi-processor system 300 in accordance with the present disclosure. Referring to FIG. 3, multi-processor system 300 may include an electrical-to-optical I/O device 310. Electrical-to-optical I/O device 310 may include an electrical I/O device 312 and a photonic component 311. Electrical I/O device 312 may be configured to receive information, data and/or signals electrically, and transmit the same information, data and/or signals, photonically through photonic component 311.

Alternatively or additionally, multi-processor system 300 may include an optical-to-electrical I/O device 320. Optical-to-electrical I/O device 320 may include an electrical I/O device 322 and a photonic component 321. Electrical I/O device 322 may be configured to photonically receive information, data and/or signals through photonic component 321 and output the same information, data and/or signals electrically. Electrical I/O device 312 and a photonic component 311 as well as electrical I/O device 322 and a photonic component 321 may be implemented as the I/O devices and photonic components in multi-processor system 100 of FIG. 1 and multi-processor system 200 of FIG. 2.

Figure 4:
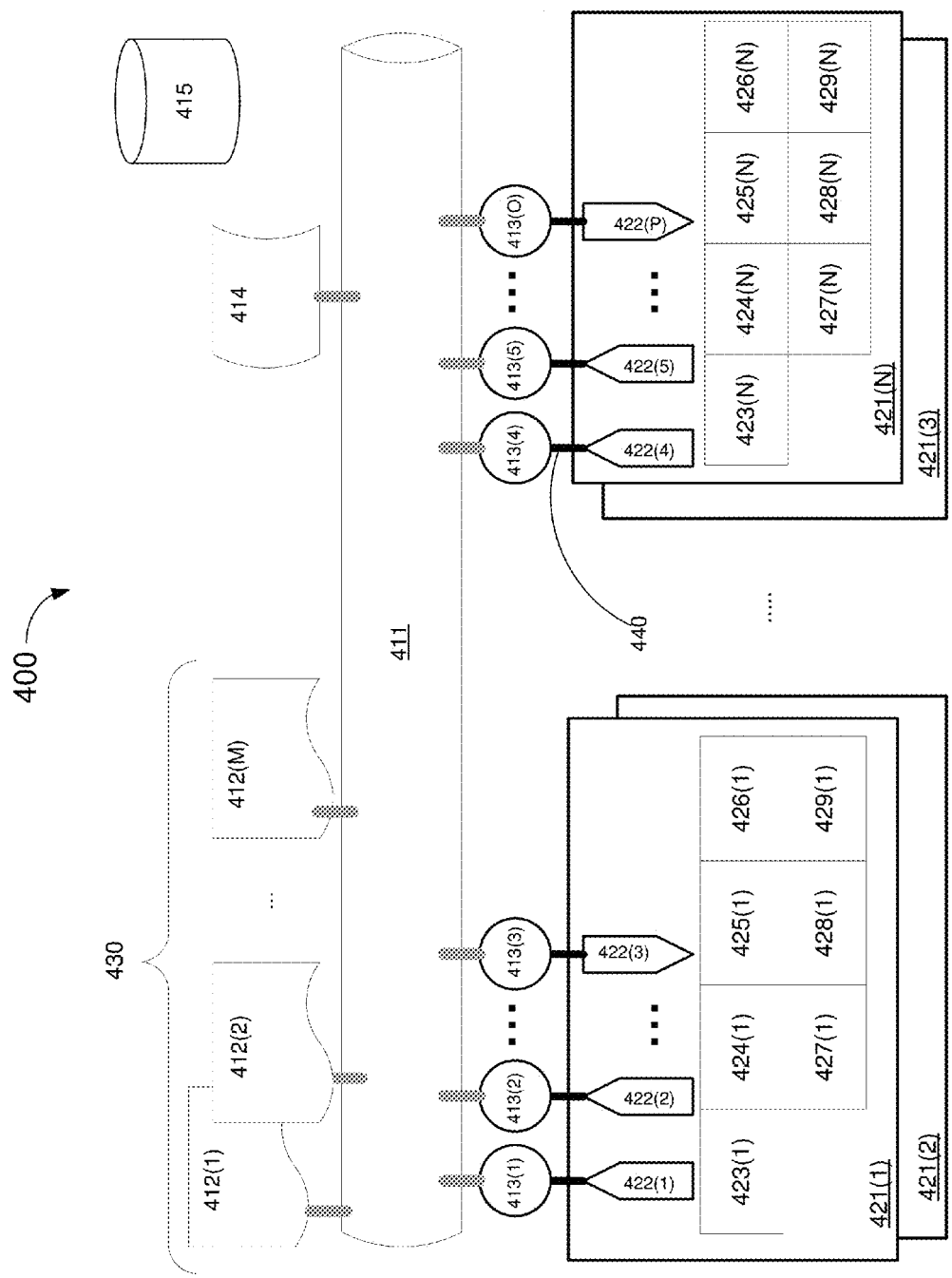
FIG. 4 is a schematic diagram of yet another photonics-optimized multi-processor system in accordance with the present disclosure.

FIG. 4 illustrates a photonics-optimized multi-processor system 400 in accordance with the present disclosure. Referring to FIG. 4, multi-processor system 400 may include a plurality of photonics-optimized processor chips 421(1)-421(N). Each of the processor chips 421(1)-421(N) may include one or more I/O components, such as I/O components 422(1)-422(P) shown in FIG. 4. Multi-processor system 400 may include a plurality of photonic components 413(1)-413(O). Multi-processor system 400 may also include a communication interconnect or inter-processor interconnect (IPI) 411, which is photonically connected to the I/O components 422(1)-422(P) of the processor chips 421(1)-421(N) through the photonic components 413(1)-413(O). That is, each of the I/O components 422(1)-422(P) may be configured to transmit or receive information, data and/or signals through a respective one of the photonic components 413(1)-413(O).

Multi-processor system 400 may also include an I/O device 414. At least one of the I/O components 422(1)-422(P) of at least one of the processor chips 421(1)-421(N) may be directly connected to one or more of the photonic components 413(1)-413(O) to connect to the I/O device 414. I/O device 414 may include a peripheral component interconnect express (PCIe), universal serial bus (USB), Ethernet, storage device, sensor or actuator.

Each or at least one of processor chips 421(1)-421(N) may include a cache (or on-chip memory), a switch (or on-chip switch), a memory management unit (MMU), a latency-hiding mechanism, a voltage regulation circuit, a coherence unit and/or a memory controller. That is, processor chips 421(1)-421(N) may include caches 423(1)-423(N), switches 424(1)-424(N), MMUs 425(1)-425(N), latency-hiding mechanisms 426(1)-426(N), voltage regulation circuits 427(1)-427(N), coherence units 428(1)-428(N) and/or memory controllers 429(1)-429(N). In the example shown in FIG. 4, processor chip 421(1) includes cache 423(1), switch 424(1), MMU 425(1), latency-hiding mechanism 426(1), voltage regulation circuit 427(1), coherence unit 428(1) and memory controller 429(1). Likewise, in the example shown in FIG. 4, processor chip 421(N) includes cache 423(N), switch 424(N), MMU 425(N), latency-hiding mechanism 426(N), voltage regulation circuit 427(N), coherence unit 428(N) and memory controller 429(N).

Multi-processor system 400 may also include one or more external devices 430. In some implementations, as shown in FIG. 4, the one or more external devices 430 may include a plurality of memory devices 412(1)-412(M) that are external to the processor chips 421(1)-421(N). Each of the memory devices 412(1)-412(M) may be connected to IPI 411 and associated with a respective one of the processor chips 421(1)-421(N) and configured to support a plurality of memory models. At least one of the I/O components 422(1)-422(P) may be directly connected to one or more of the photonic components 413(1)-413(O) to provide address information 440 to at least one of the memory devices 412(1)-412(M). Each or at least one of the memory devices 412(1)-412(M) may be cache-coherent with the cache of the associated one of the processor chips 421(1)-421(N).

Multi-processor system 400 may also include a directory subsystem 415 to keep precise information about the location of shared memory blocks. When the state of a shared memory block changes, coherence messages may be sent to all of the sharers (one or more of the memory devices 412(1)-412(M) that contain a copy of that block) and none of the non-sharers to minimize coherence traffic. The coherence units 428(1)-428(N) may use information provided by the directory subsystem 415 to implement a scalable coherence protocol in which the coherence traffic is O(N), where N is the number of cores or processor chips. The coherence traffic of the coherence protocol is greatly reduced as compared to that of non-coherence protocols, or snoopy protocols, the coherence traffic of which is $O(N^2)$. The $O(N^2)$ coherence traffic of non-coherence protocols results from the fact that the total number of coherence messages is proportional to the number of cores or processor chips and all coherence messages are sent to all cores or processor chips. The coherence protocol implemented by the multi-processor system 400 is therefore scalable with the total number of processor chips in the system, an advantage that snoopy protocols do not provide.

In order to maintain precise tracking of sharers and thus low coherence traffic, directory subsystem 415 may store a directory entry for every memory block. The directory entry may contain the state of that the respective memory block and a list of every sharer of the block. The photonics-optimized processors (POPs) of the present disclosure are optimized for systems with large numbers of processor chips, so scalability is important. A simple but non-scalable implementation is to provide storage for every memory block for all potential sharers. For example, a directory may have a table in which there is a row for every memory block and the row contains a directory entry which contains the state of the block and a bit vector in which there is a bit for every potential sharer. For this non-scalable implementation, the size of the bit vector must be increased as the number of processor chips grows. An alternative, scalable method employed by the present disclosure is to replace the bit vector with i pointers to potential sharers. This method is scalable since i does not depend on the number of processor chips. However, the optimal value of i depends on the degree to which the software causes the memory block to be shared. If the block is shared among more than i caches, extra invalidations occur, which reduces performance. The maximum number of sharers has a practical limit because the performance and scalability of parallel software typically depends on avoiding sharing memory blocks among a large number of processors. For example, if the software creates a "hot spot" through excessive sharing of a memory block, the software performance may be limited by congestion in the IPI, queuing at the memory controller, or other factors, rather than by a shortage of pointer storage in the directory. Proper hardware-software co-design can ensure that there is a reasonable bound on the number of sharers per block and that there is feedback to the software to improve performance by staying within the bound. The hardware architectural goal is to minimize extra invalidations while minimizing the total storage allocated to pointers.

The average number of sharers per memory block is independent of the number of processors and can be estimated as the ratio of the size of the caches on a processor chip divided by the size of its local off-chip memory. For example, a processor chip may have 32 megabytes (MB) of cache and 64 gigabytes (GB) of local off-chip memory. Only one out of 2,000, or 0.05%, of the memory blocks will fit into the cache at the same time. Typical architectures allocate at least one pointer for every memory block, so 1,999 out of 2,000 would be unused. Furthermore, if there are multiple sharers for a memory block, there is no mechanism for storing the pointers for these additional sharers in the unused directory entries for other memory blocks.

The directory subsystem 415 may be configured to support varying numbers of sharers per memory block. The directory subsystem 415 may be configured with a hashing function or other means to compress the directory table to minimize storage for pointers allocated to memory blocks which have no sharers. The number of pointers allocated to memory blocks which do have sharers may be varied by changing the size of the list element in the directory table or by chaining additional storage for pointers to the list. The performance of directory subsystem 415 may be improved by caching some of the directory information.

The present invention may use the properties of ISP and/or three-dimensional (3D) dynamic random access memories (DRAMs) to minimize the cost of directory storage and optimize performance. ISP may provide sufficient bandwidth for a processor chip to simultaneously access two or more 3D DRAMs. The directory information may thus be stored in a 3D DRAM separately from the memory block data and retrieved in parallel with accessing the memory block data without increasing the access time to the memory block data.

A 3D DRAM stack may include one or more logic chips which may be used to implement a directory subsystem 415. Such a directory subsystem has extremely high bandwidth and low latency access to directory information stored in the 3D DRAM stack.

ISP may provide sufficient bandwidth so that the 3D DRAM may have two or more types of interface. The two or more types of interface may be implemented simultaneously on one or all of its logic chips. One type of interface may be a very simple and fast interface to the associated respective processor chip and/or to another 3D DRAM, e.g., one that contains directory information. Another type of interface may be compatible with the IPI so that other processor chips may access the 3D DRAM directly without consuming their own bandwidth. A switch with two or more ports to the IPI may be employed to provide redundancy and increase bandwidth to the IPI.

Figure 5:
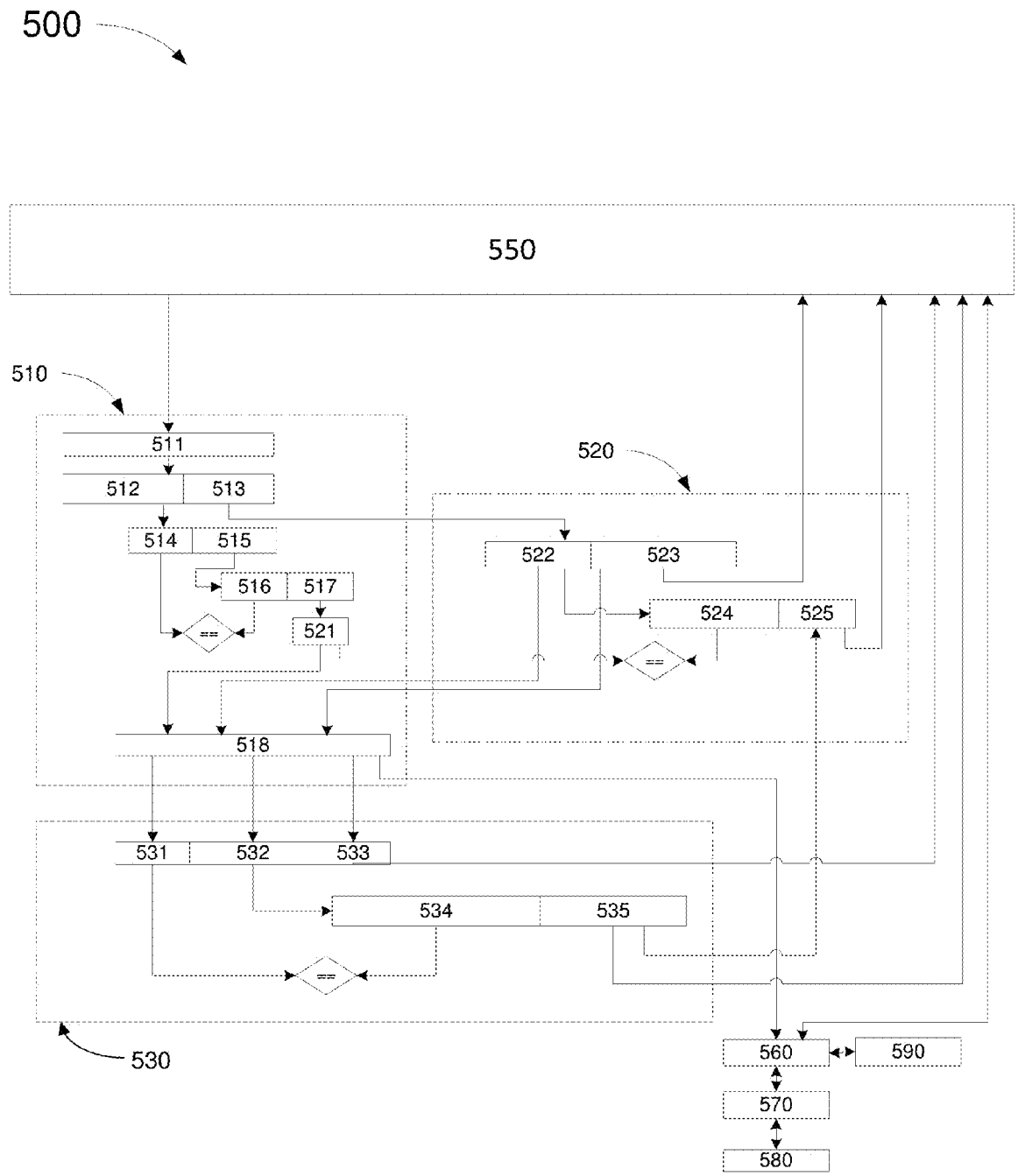
FIG. 5 is a schematic diagram of a memory hierarchy for a photonics-optimized processor core in accordance with the present disclosure.

FIG. 5 illustrates a memory hierarchy 500 for a photonics-optimized processor core in accordance with the present disclosure. A photonics-optimized processor chip, such as any of the processor chips 121(1)-121(N) of FIG. 1, 221(1)-221(N) of FIGS. 2 and 421(1)-421(N) of FIG. 4, may include a plurality of processor cores. Referring to FIG. 5, each processor core may have a memory hierarchy that may include a respective CPU 550, a respective MMU 510 and a respective level 1 (L1) cache 520. Other components of the memory hierarchy may be shared among a plurality of cores. The shared components of the memory hierarchy may include a plurality of level 2 (L2) caches 530, a plurality of coherence units 560, a plurality of memory controllers 570, a plurality of main memory devices 580 and a plurality of IPI interfaces 590. A photonics-optimized multi-processor system may include many times more processor chips and memory devices than a typical legacy system, and thus require a larger address space to be addressed efficiently. For example, to contain 10,000 times more memory devices, the additional address space may require the size of the virtual address (VA) and physical address (PA) to be increased by 14 bits. Furthermore, the sizes of various components of the memory hierarchy must be increased accordingly. A preferred embodiment, as shown in FIG. 5, may have a 64-bit VA 511 and a 64-bit PA 518. The size of the virtual page number 512 and the page offset 513 may need to be increased so that the combined size of the two is 64 bits, instead of the 48-bit combined size used in typical legacy processors. The size of the virtual page number 512 may be increased to allow a larger number of virtual pages in the VA space. The maximum size of the page offset 513 may be increased to 60 or 64 bits to allow very large page sizes. The memory hierarchy may also include a translation lookaside buffer (TLB). The sizes of the TLB tag compare address 514 and TLB tag 516 may be increased to accommodate the increased number of virtual pages. The TLB data 517, the L1 tag compare address 521, the L1 cache tag 524, the L2 tag compare address and the L2 cache tag may be increased to accommodate the larger PA. Similar changes may be made to the coherence unit 560 and the IPI interface 590 to accommodate the increased size of the PA. Other components of the memory hierarchy may not be affected by the changes in the VA and PA. The size of the TLB index 515 is determined by the number of entries in the TLB 510. The TLB comprises the TLB tags 516 and the TLB data 517. The size of the L1 cache index 522 is determined by the number of blocks in the L1 cache 520. The size of the L1 block offset is determined by the number of bytes in a L1 cache block. The L1 cache is comprised of the L1 cache tags 524 and the L1 data 525. The size of the L1 data 525 is determined by the size of a L1 cache block. The size of the L2 cache index 532 is determined by the number of blocks in the L2 cache 530. The L2 block offset 533 is determined by the number of bytes in a L2 cache block. The address size for the memory controller 570 is determined by the size of the main memory 580.

Figure 6A:
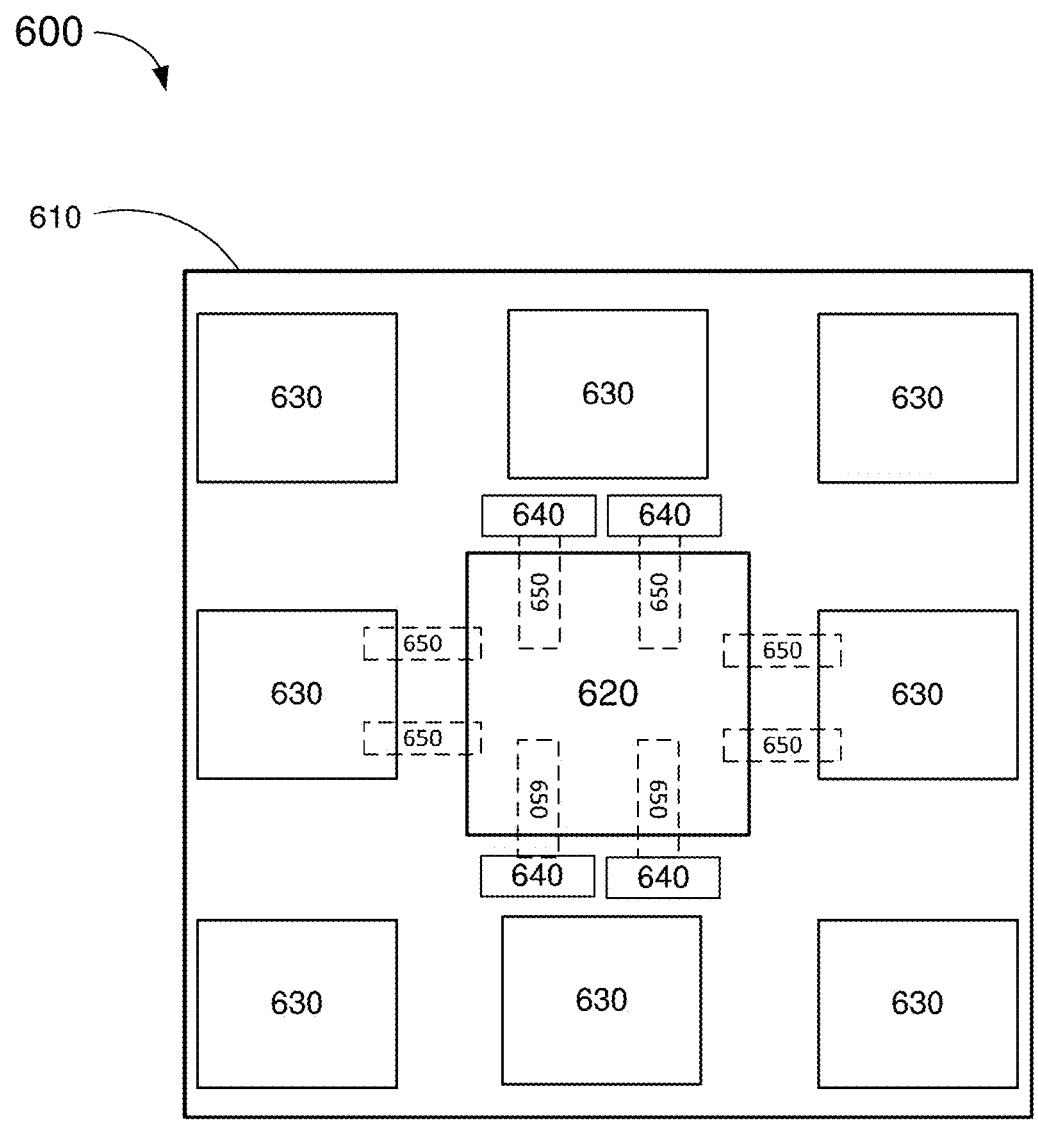
FIGS. 6A, 6B and 6C illustrate schematic diagrams of a processor-memory tile in accordance with the present disclosure.
Figure 6B:
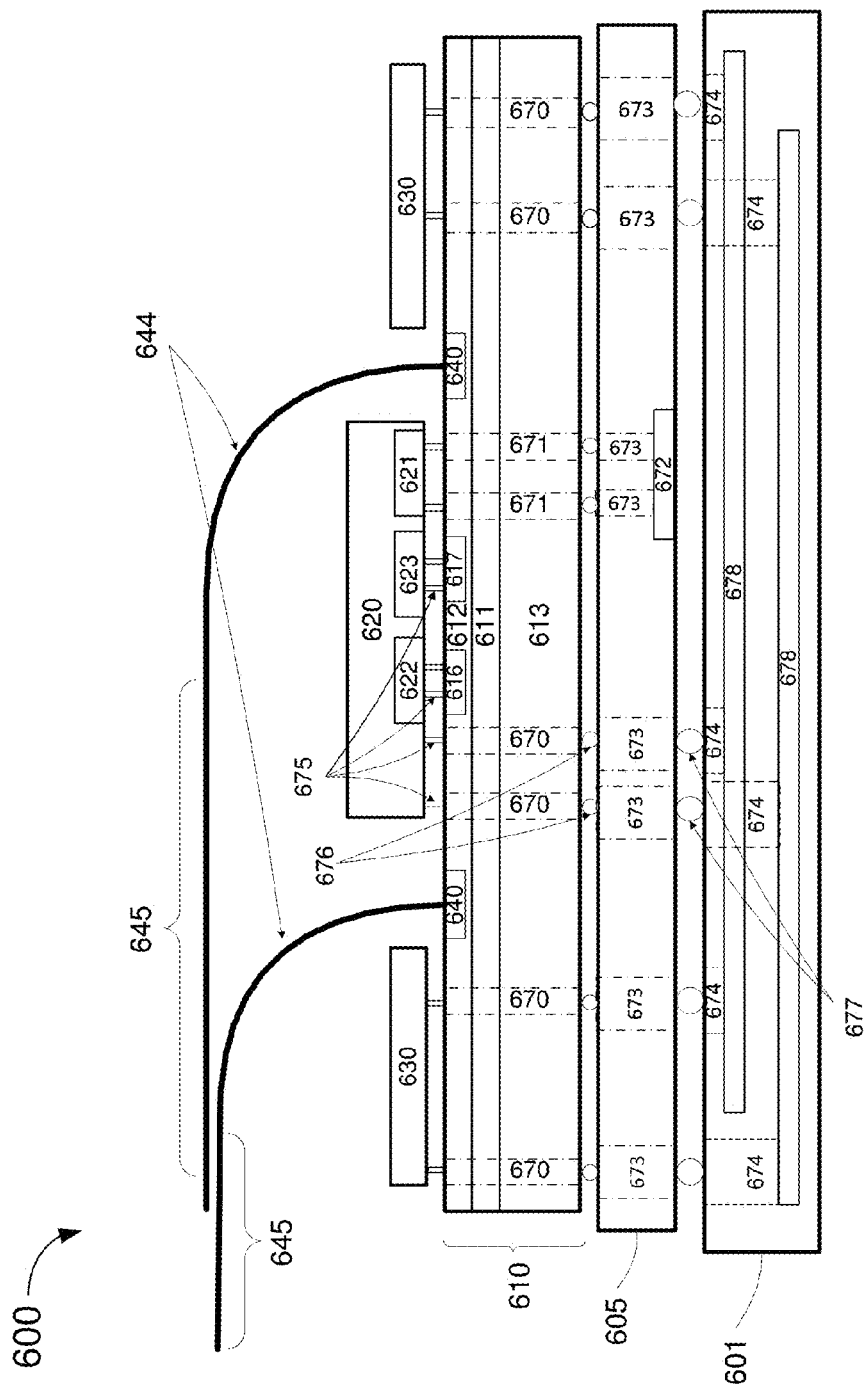
Figure 6C:
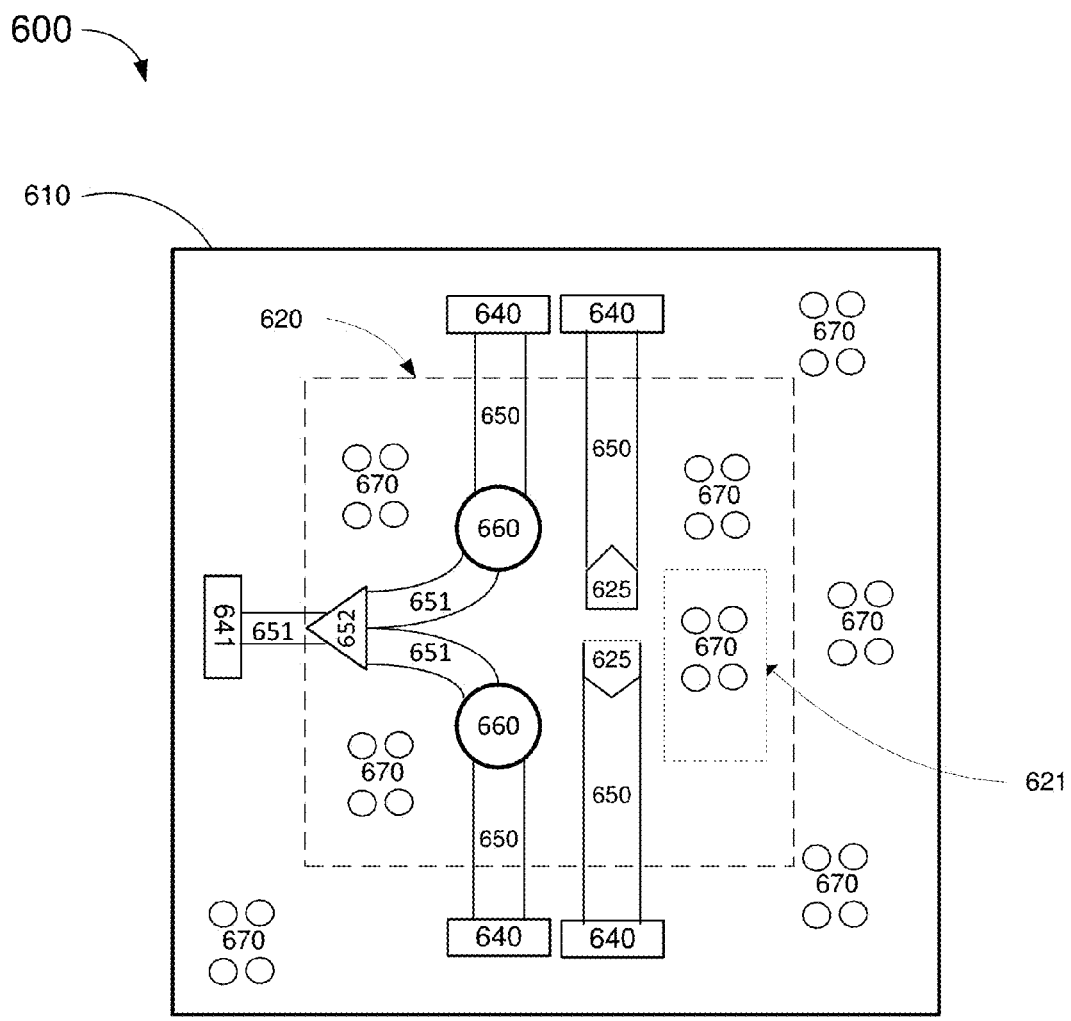

A photonics-optimized processor may be packaged and assembled so that a supercomputer comprising 32,000 or more processor chips and 2 petabytes of memory may fit in a very small volume. Advanced techniques in photonic interconnect, packaging, power delivery, and cooling technology may be required to achieve such a high density of processing capability. Each processor chip may be assembled using 2.5-dimensional (2.5D) integration techniques as part of a processor-memory tile. FIGS. 6A, 6B and 6C illustrate a processor-memory tile 600 in accordance with the present disclosure. Referring to FIG. 6A, a photonics layer 610 may be used as a substrate for the tile. The processor chip 620 and the 3D DRAM memory stacks 630 may be flip-chip bonded to contacts on the photonics layer 610. The grating couplers 640 and the waveguides 650 are configured to carry light in fibers, thereby forming communication links to other processor chips (not shown) and to photonic components (not shown) under the processor chip 620. The waveguides 650 may also form communication links between the processor chip 620 and 3D DRAM memory stacks 630 on the same photonic layer 610. Referring to the cross-section view of FIG. 6B, the photonics layer 610 may comprise a portion of a Silicon-On-Insulator (SOI) wafer. The top silicon layer 612 may be 220 nm thick and used to form waveguides therein. The buried oxide (BOX) layer 611 may be 2 microns thick and used to form part of a cladding around the waveguides to achieve total internal reflection. The layer of silicon which forms the base wafer 613 may be 775 microns thick and used to provide a desired mechanical strength for the processor-memory tile 600. Copper pillars 675 are used to connect various devices on the processor chip 620 to the photonics layer 610. For example, a copper pillar 675 connects the transmitter (Tx) circuit 622 on the processor chip 620 to the modulator 616 on the silicon layer 612. Similarly, a copper pillar 675 connects the receiver (Rx) circuit 623 on the processor chip 620 to the photodiode 617 on the silicon layer 612. Also, a copper pillar 675, together with a Through Silicon Via (TSV) 670 in the photonic layer 610, a Flip Chip (FC) ball 676, a Ball Grid Array (BGA) substrate via 673, a BGA ball 677 and a PCB via 674, provide vertical power and ground connections for the processor chip 620 by connecting to the power and ground planes 678 of the PCB 601. The PCB 601 is included in FIG. 6B for illustrative purposes, but is not part of the tile 600. The BGA substrate 605 may be 1.1 mm thick, while the PCB 601 may be 1.6 mm thick. Namely, the distance from a transistor on the processor chip 620 to a bottom ground plane of the PCB 601 may be, for example, as short as 3.78 mm. These vertical connections are much shorter than connections that would have routed otherwise on a horizontal metal layer in a conventional method. The total thickness of the stack, from the bottom of the PCB 601 to the back side of the processor chip 620 may be 5 mm. Optical fiber ribbons 644 are coupled with grating couplers 640 at an angle that is close to 90 degrees. The optical fiber ribbons 644 may have a minimum bend radius of 12.7 mm, so the horizontal segment 645 may be 17 mm above the bottom of the PCB 601. Thus a processor-memory tile 600 may be packaged in a packaging box with an inside vertical dimension of 17 mm. Alternatively, the optical fiber ribbons 644 may be coupled with the grating couplers 640 through some optical systems that include 45 degree angle mirrors, and thus coupled with the grating couplers 640 at an angle that is close to 0 degrees. In this case, the optical fiber ribbons 644 would extend no more than 6 mm from the bottom of the PCB 601 in the vertical direction, and the inside vertical dimension of the packaging box may thus be reduced. TSVs 670 also provide power and ground for the memory stacks. TSVs 671 and substrate vias 673 provide connections from voltage converter circuits 621 on the processor chip 620 to inductors 672 embedded in the BGA substrate 605 below. The voltage converter circuits 621 may be used to integrate multiple power supplies on the processor chip 620. Photonic connections are used for all signals, so the number of copper connections is greatly reduced, which improves reliability and cost.

Referring to FIG. 6C, photonic components may be formed in the photonic layer 610 using standard CMOS processing techniques. One or more grating couplers 640, waveguides 650, modulators 660 and photodetectors 625 may be formed therein. One or more grating couplers 641, waveguides 651, and splitters 652 may also be formed therein to deliver continuous wave (CW) laser power to the modulators 660. An outline of the processor chip 620 is illustrated in FIG. 6C to show that the modulators 660 and the photodetectors 625 may be underneath the processor chip 620. The Tx circuit 622 and the Rx circuit 623 of the processor chip may be placed such that they are directly above the modulators 660 and photodetectors 625. This placement is advantageous because it reduces the length of electrical connection paths from a conventional 150 mm to less than 50 microns.

The use of integrated photonics and the relevant packaging techniques described above result in a significant improvement in the electrical performance of the photonics-optimized processor system according to the present disclosure. Meanwhile, a very rather large volume of packaging materials, including PCB area, sockets, packages, and connectors, is removed.

Figure 7:
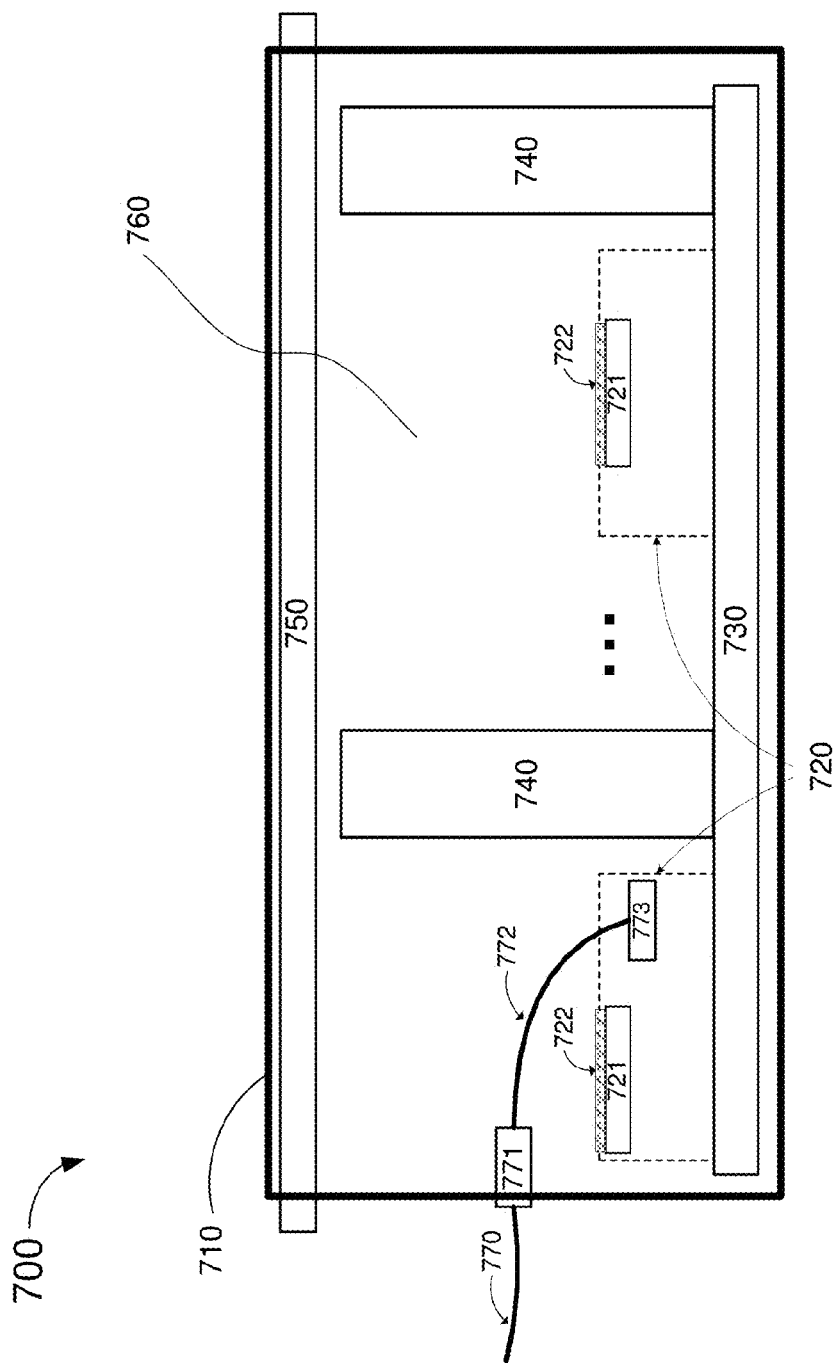
FIG. 7 is a schematic diagram of a Compute Module in accordance with the present disclosure.

A Compute Module (CM) may package together a plurality of processor-memory tiles, means to provide electrical power and cooling, and connections to ribbon fiber cables. Referring to FIG. 7, a CM 700 may include a box 710 enclosing one or more processor-memory tiles 720. The CM 700 may also include a motherboard PCB 730, one or more Voltage Regulator Modules (VRM) 740, and one or more heat exchangers 750. One or more single-mode ribbon fiber connectors 771 may be mounted on a panel of the box 710. A fiber ribbon 772 may connect a grating coupler 773 in a tile 720 to an inner end of the connector 771. A fiber ribbon cable 770 may connect to an outer end of the connector 771. The box 710 may be filled with a dielectric coolant 760 which is in contact with the back side of the processor chips 721 and other components in the tiles 720. A heat exchanger 750 may contain circulating water or other coolant fluid at a temperature below the boiling point of the dielectric coolant 760, and serve to condense the coolant 760 from vapor phase to liquid phase. Each of the processor chips 721 may have a layer of sintered copper Boiling Enhancement Coating (BEC) 722 on the back side, with the BEC 722 serving as a heat spreader. Aided with the BEC 222, the dielectric coolant 760 may be able to remove a heat flux of 35 W/cm$^2$ from each of the processor chips 721 when it is heated and changes to vapor phase. A processor chip 721 may not require such a heat spreader if it generates a lower head flux. This phase-changing liquid cooling system may be much more efficient and require substantially less space than an air cooling system or a single phase liquid cooling system. The PCB 730 may connect the VRM 740 to a power source outside of the CM 700. The VRM 740 may convert a higher voltage to a lower voltage so that electrical power can be delivered to the CM using smaller conductors. The PCB 730 may connect a VRM 740 to the tile 720 using large conductors for a high current that is needed to deliver power at a low voltage. The VRM 740 may be placed close to the tile 720 to minimize the length of the large conductors. A CM 700 containing 16 processor-memory tiles 720 may be fit into a box 710 with outer dimensions of 275 mm in length, 370 mm in width and 20 mm in height.

Figure 8A:
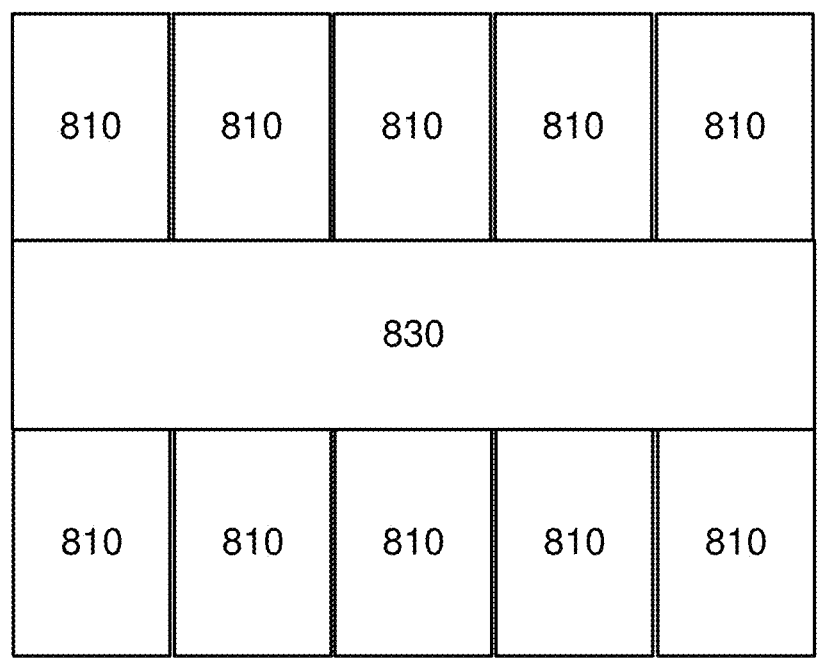
FIGS. 8A and 8B illustrate, respectively, a top view and a front view of a supercomputer Compute Unit in accordance with the present disclosure.
Figure 8B:
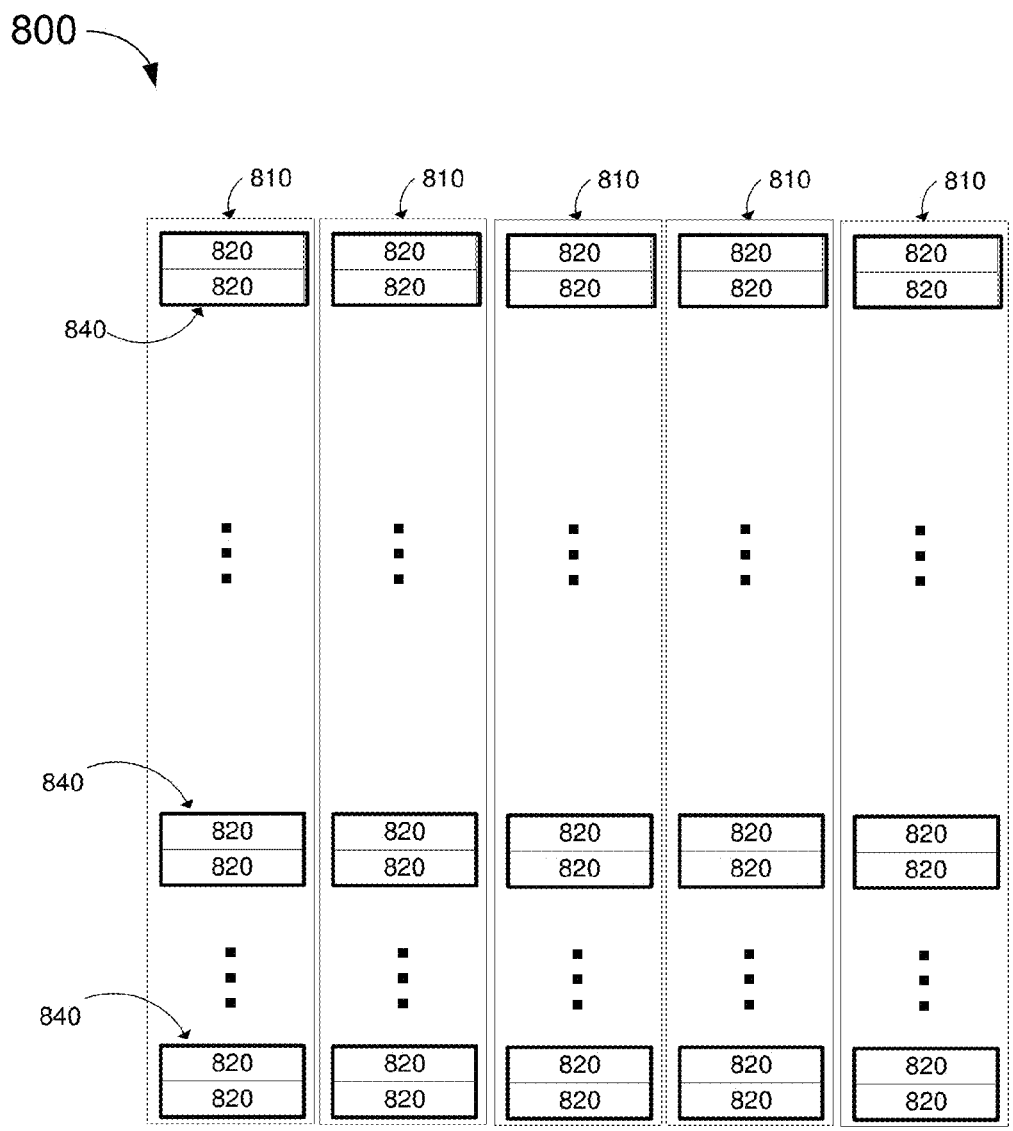

A plurality of Compute Modules (CMs) may be assembled to form a supercomputer Compute Unit (CU). Referring to a top view of a CU as illustrated in FIG. 8A, a CU 800 may include as many as 10 racks 810 and a Fiber Vault 830. A rack 810 may be 390 mm wide, 2500 mm high and 580 mm deep. A Fiber Vault 830 may contain 2 million single-mode fibers and may be 1950 mm wide, 2500 mm high and 500 mm deep. Referring to a front view of the CU 800 as illustrated in FIG. 8B, a rack 810 may contain a plurality of CM 820. A rack 810 may have 57 drawers 840 each of which is 44.5 mm high. The height of the rack 810 is also known as 1 Rack Unit (RU). A drawer 840 may be 580 mm deep, enough to place two CMs 820, one in the front (as shown in FIG. 8B) and one in the back (not shown). Since the height of a CM 820 is 20 mm, a second layer of two CM 820 may be placed on top of a first layer of two CM 820. Thus a drawer 840 may contain 4 CMs 820 and a rack may therefore contain 228 CMs 820. A drawer 840 may contain ribbon fiber connectors mounted on a back panel, and the ribbon fiber connectors may subsequently blind-mate to connectors on a Fiber Vault 830. In this way, photonic connections may be made among all of the CMs 820 in the CU 800. The CU 800 may contain 2,280 CMs 820 with a total of 36,480 processor-memory tiles, or 1,167,360 cores, in 36,480 photonics-optimized processor chips, as well as 2.3 petabytes of memory, all in a volume of 8 cubic meters. The maximum distance between any pair of processor chips of the CU may be 3.6 m, and the maximum latency due to the speed-of-light propagation delay between any pair of processor chips may be 39 ns. A time budget of 100 ns for a global memory access may be divided into 2 parts, the first part being 39 ns to account for the latency due to the speed-of-light propagation delay, and the second part being 61 ns to account for the propagation delay caused by the IPI switches and other logic along a path from a core to a memory. In contrast, a conventional supercomputer with a similar number of cores and memory size may require a space of 280 cubic meters. A maximum distance between any pair of processor chips may be 33 m and a maximum latency due to the speed-of-light propagation delay between any pair of processor chips may be as much as 360 ns. This almost 10 times higher latency due to the speed-of-light propagation delay makes a time budget of 100 ns infeasible, and thus the performance of a conventional supercomputer is significantly limited. From the comparison, it is obvious that a reduction in size leads to a reduction in latency, which gives a significant advantage to the present invention.

Figure 9:
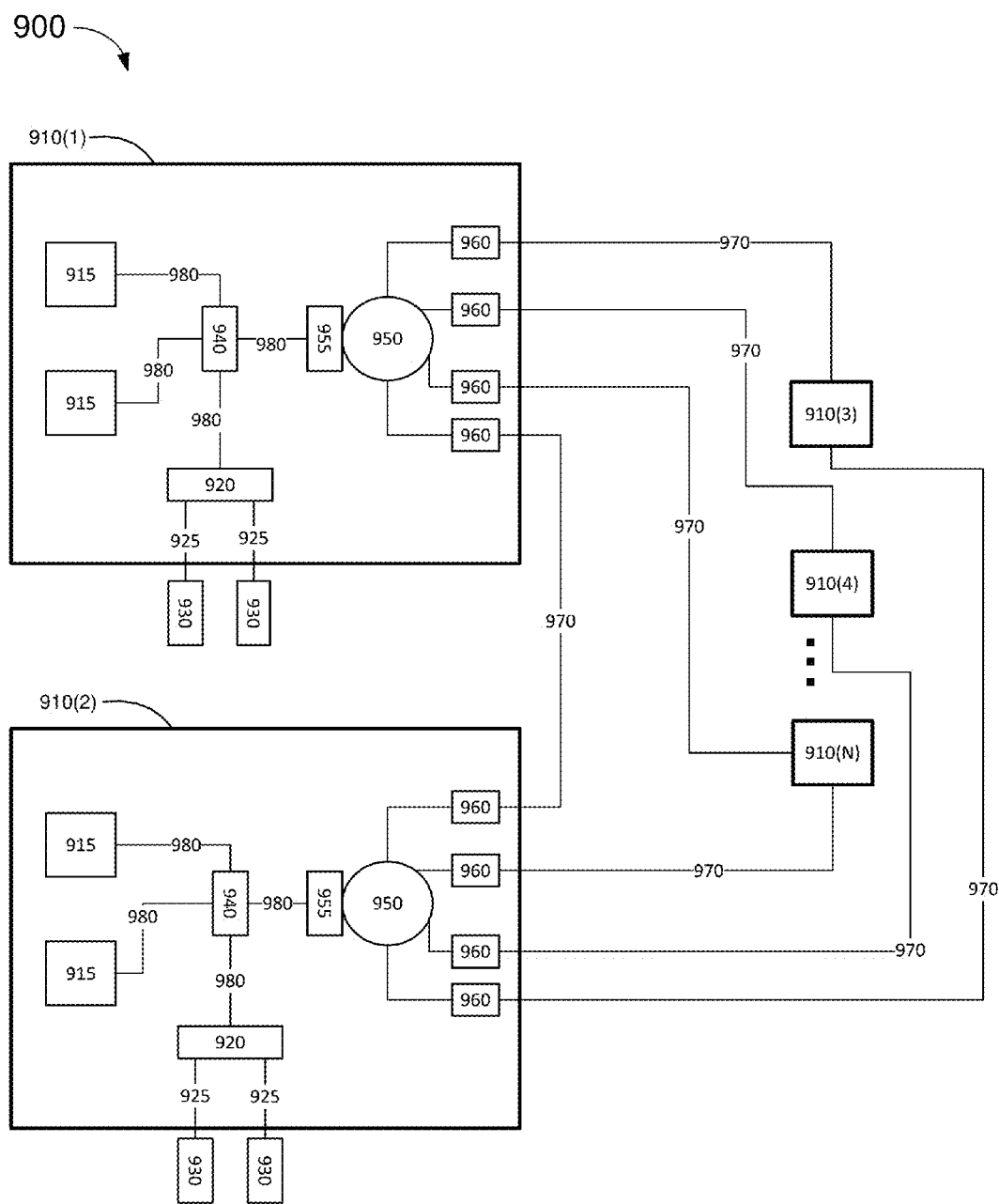
FIG. 9 is a schematic diagram of a photonics-optimized multi-processor multi-core system in accordance with the present disclosure.

A system with two or more processor chips, such as the one shown in FIG. 9, may be used to illustrate the communication among processor cores and off-chip memories. Referring to FIG. 9, a multi-processor system 900 may include a plurality of processor chips 910(1), 910(2) . . . 910(N). Each of the processor chips 910(1), 910(2), . . . , 910(N) may include one or more cores 915, an on-chip interconnect (OCI) 940, OCI wires 980, a memory controller 920, an IPI interface 955, an IPI switch 950, and one or more photonic interfaces 960. The memory controller 920 may connect to one or more off-chip memory devices 930 through memory control wires 925. A core 915 of a processor chip may communicate with an off-chip memory device 930 of the same processor chip. This local communication can be realized through a path that is successively composed of an OCI wire 980, the OCI 940, another OCI wire 980, the memory controller 920 and a memory control wire 925, all of which are of the same processor chip. Alternatively, a core 915 may communicate with an off-chip memory device 930 of a different processor chip. For example, a core 915 of the processor chip 910(1) may communicate with an off-chip memory device 930 of the processor chip 910(2). This remote communication can be realized through a path that is successively composed of an OCI wire 980, the OCI 940 of the processor chip 910(1), another OCI wire 980, the IPI interface 955 of the processor chip 910(1), the IPI switch 950 of the processor chip 910(1), a photonics interface 960 of the processor chip 910(1), a fiber 970 between the processor chip 910(1) and the processor chip 910(2), a photonics interface 960 of the processor chip 910(2), the IPI switch 950 of the processor chip 910(2), the IPI interface 955 of the processor chip 910(2), another OCI wire 980, the OCI 940 of the processor chip 910(2), another OCI wire 980, the memory controller 920 of the processor chip 910(2) and a memory control wire 925.

In order to achieve satisfactory performance for both the local and remote communications stated above, it is essential for the communication paths to have enough bandwidth. Specifically, for each of the processor chips of the multi-processor system, the OCI 940 must provide enough bandwidth between the cores 915 of the processor chip and the IPI interface 955 to avoid communication congestion along the path. In addition, for each of the processor chips, the OCI 940 must provide enough bandwidth between the cores 915 of the processor chip and the memory controller 920 to avoid congestion along the path. Furthermore, for each of the processor chips, the OCI 940 must also provide enough bandwidth between the IPI interface 955 and the memory controller 920 to avoid congestion along the path.

In the case of a low locality application, substantially each of the cores 915 of the multi-processor system will be communicating with other processor chips, the ones to which the core does not belong, so as to access global memory. Similarly, substantially all of the communications of a memory controller 920 of the multi-processor system will be with cores 915 of other processor chips. Therefore, in this low locality case, for each of the processor chip, the bandwidth requirements for the IPI interface 955 and the IPI switch 950 will be approximately equal to the sum of the bandwidth requirements of the cores 915 and the memory controller 920.

In one example implementation, a multi-processor system may include a plurality of photonic components and a plurality of processor chips each of which includes at least one input/output (I/O) component that is designed to directly drive a first photonic component (e.g., modulator) of the photonic components or receive a signal from a second photonic component (e.g., photodetector) of the photonic components. Each of the I/O components of the processor chips may include substantially photonics, and/or may not include any high voltage "I/O" transistors. In some embodiments, a metal path connecting at least one of the processor chips to at least one of the photonic components may be constructed so that parasitics, e.g., resistance, inductance, capacitance, of the metal path cause less than 3 dB of signal attenuation. In some embodiments, the capacitance of the metal path may be less than one or several femto-Farads (fF). In some embodiments, a length of the metal path may be less than one or several microns (μm) or millimeters (mm). In some embodiments, an interface circuit that interfaces with the at least one of the photonic components may be constructed using high performance and low voltage "core" transistors of the processor. In some embodiments, the processor chip may be manufactured by a process which eliminates the wafer fabrication CMOS process steps for building high voltage I/O transistors. In some embodiments, at least one of the photonic components may be made monolithically on a separate semiconductor wafer or portion of a wafer (photonic wafer). In some embodiments, at least one of the photonic components may be made monolithically on the same semiconductor wafer or portion of a wafer as the processor. In some embodiments, at least one of the photonic components on the photonic wafer may include active components, such as the final stage of a modulator driver or a pre-amplifier for the photodetector. In some embodiments, at least one of the photonic components may be connected to the processor die using 2.5-dimensional (2.5D) or 3-dimensional (3D) packaging technology. In some embodiments, at least some of the photonic components may be contained in the same package. In some embodiments, the multi-processor system may further include two or more I/O components that are designed as a transceiver pair configured to transmit and receive signals.

In one example implementation, a multi-processor system may include a plurality of processor chips each of which includes a set of two or more I/O components which are designed to connect to photonic components for wavelength-division multiplexing (WDM). In some embodiments, the multi-processor system may further include one or more waveguides configured for WDM. In some embodiments, the multi-processor system may further include one or more fibers configured for WDM. In some embodiments, at least one of the one or more fibers may be a single-mode fiber. In some embodiments, the processor may be configured to perform WDM using one or more fibers where an optical path may include a grating coupler. In some embodiments, at least one of the processor chips may be configured to perform WDM using one or more fibers where an optical path may include an edge coupler. In some embodiments, at least one of the processor chips may be configured for WDM using one or more fibers where an optical path may include a micro-mirror.

In one example implementation, a multi-processor system may include a plurality of processor chips each of which includes a set of two or more I/O components which are designed to connect to photonic components. In some embodiments, at least one of the processor chips may include a forwarded clock device configured to generate a forwarded clock signal, and at least one of the processor chips may be configured to use a data recovery scheme based on the forwarded clock signal. In some embodiments, at least one of the processor chips may include a parallel-to-serial and serial-to-parallel scheme based on the forwarded clock signal. In some embodiments, the multi-processor system may further include a waveguide or fiber, and the forwarded clock signal and data may travel in the same waveguide or fiber. In some embodiments, at least one of the processor chips may be configured to transmit the forwarded clock signal and data using light of different wavelengths.

In one example implementation, a multi-processor system may include a plurality of processor chips each of which includes at least one I/O component which is designed to directly receive a central clock signal which is distributed photonically (via photonic components of the multi-processor system) to one or more other processor chips. In some embodiments, the central clock signal may be configured to allow at least one of the processor chips to clock isochronously with one or more others of the processor chips. In some embodiments, the central clock signal received by the processor chips may have a central source, e.g., a central clock device of the multi-processor system.

In one example implementation, a multi-processor system may include a plurality of processor chips each of which includes an internal clock and at least one I/O component which is designed to directly interface with photonic components of the multi-processor system and receives photonically phase and/or frequency information from one or more external sources, e.g., one or more other processors. In some embodiments, the internal clock may be controlled by the phase and/or frequency information from the one or more external sources. In some embodiments, the at least one I/O component may be configured to directly interface with photonics and transmit photonically phase and/or frequency information to at least one of the processor chips. In some embodiments, the internal clock of the at least one of the processor chips may participate in a distributed phase locked loop among two of more of the processor chips of the multi-processor system. In some embodiments, the internal clock may be isochronous with the internal clock of one or more others of the processor chips of the multi-processor system.

In one example implementation, a multi-processor system may include a plurality of photonic components and a plurality of memory devices. The multi-processor system may also include a plurality of processor chips each of which includes cache and at least one I/O component which is designed to directly connect to the photonic components to transmit and receive data with at least one of the memory devices through one or more of the photonic components. In some embodiments, the processor chip may include more than one processing elements, or cores, and each of the cores may have a cache or memory device associated with it. In this case, a bandwidth to a memory device associated with one of the processor chips may be greater than 50% of an aggregate bandwidth to the cache of the plurality of the cores on that processor chip. In some embodiments, at least one of the memory devices may include DRAM. In some embodiments, at least one of the memory devices may include non-volatile random access memory (NVRAM), e.g., flash memory.

In one example implementation, a multi-processor system may include a plurality of processor chips each of which includes a cache and at least one I/O component which is designed to directly connect to photonic components to communicate data with one or more other processors. In some embodiments, each or at least one of the processor chips may also include an on-chip switch. In some embodiments, the on-chip switch may be configured to provide full global bandwidth to an IPI that connects the processor chips. In some embodiments, the on-chip switch may be configured to provide an injection bandwidth greater than 50% of an aggregate bandwidth to memory of a plurality of cores on the processor chip in a multi-processor system. In some embodiments, the on-chip switch may be configured to provide an injection bandwidth greater than 200% of an aggregate bandwidth to memory of a plurality of cores on the processor chip in a multi-processor system. It is so configured to provide good performance in the case that all cores are accessing memory that is directly attached to a different processor chip. In some embodiments, the on-chip switch may be configured with a radix greater than or equal to a number required so that a number of hops required to reach any other processor chip is not greater than 3. In some embodiments, each or at least one of the processor chips may further include a switch that uses a table-driven router. In some embodiments, each or at least one of the processor chips may further include a switch that performs dynamic routing. In some embodiments, each or at least one of the processor chips may further include a switch that uses a buffer pool architecture.

In one example implementation, a multi-processor system may include a plurality of processor chips each of which includes at least one I/O component which is designed to directly connect to photonic components to provide address information to an external device, e.g., DRAM or processor. In some embodiments, the multi-processor system may further include a physical address (PA) component configured to address all of the physical memory in the system, including the memory connected to all of the processor chips. In some embodiments, each or at least one of the processor chips may further include a plurality of memory devices and a memory management unit (MMU). The MMU is configured to accept virtual addresses (VAs) up to 64 bits or more and produce physical addresses (PAs) up to 64 bits or more. In some embodiments, each or at least one of the processor chips may further include a plurality of memory devices and a memory management unit (MMU). The MMU is configured to manage large pages such that mappings for all memory devices in the system can be contained in a translation lookaside buffer (TLB), e.g., of less than 1,000 entries, simultaneously.

In one example implementation, a multi-processor system may include a plurality of processor chips each of which includes at least one I/O component which is designed to directly connect to photonic components for communication and that has a latency-hiding mechanism. In some embodiments, the latency-hiding mechanism may include hardware threads, e.g., simultaneous multi-threading (SMT) threads. In some embodiments, the latency-hiding mechanism may include multiple outstanding memory references. In some embodiments, the latency-hiding mechanism may include a use of barrier and cache coherence protocols.

In one example implementation, a multi-processor system may include a plurality of photonic components and a plurality of memory devices. The multi-processor system may also include a plurality of processor chips each of which includes a cache and at least one I/O component which is designed to directly connect to one or more of the photonic components to provide address information to at least one of the memory devices. The memory devices may be external to the processor chips. Each of the memory devices may be associated with a respective one of the processor chips and configured to support various memory models. In some embodiments, each or at least one of the memory devices may be cache-coherent with the associated one of the processor chips. In some embodiments, each or at least one of the memory devices may be not cache-coherent with the associated one of the processor chips. In some embodiments, the memory models may be user-controllable. In some embodiments, each or at least one of the processor chips may further include a MMU, and a selection of the memory models may be a user-controllable attribute of page mapping in the MMU.

In one example implementation, a multi-processor system may include a plurality of processor chips each of which includes at least one I/O component which is designed to directly connect to photonic components to connect to at least an I/O device. In some embodiments, the I/O device may be a standard interface, such as peripheral component interconnect express (PCIe), universal serial bus (USB), Ethernet, Infiniband, and the like. In some embodiments, the I/O device may include a storage device. In some embodiments, the I/O device may include a sensor or actuator.

In one example implementation, a multi-processor system may include plurality of photonic components and an off-chip memory. The off-chip memory may be shared by more than one of the processor chips. The off-chip memory may be directly connected to a single processor chip and shared with other processor chips using a global memory architecture implemented by using a processor-to-processor approach. The multi-processor system may also include a cache and a plurality of processor chips each of which includes at least one I/O component which is designed to directly connect to the photonic components to communicate with one or more other processor chips. At least one I/O component of at least one of the processor chips may be configured to use a directory-based cache-coherence protocol. In some embodiments, a cache of at least one of the processor chips may be configured to store directory information. In some embodiments, the off-chip memory may include a DRAM. In some embodiments, directory information may be stored in the off-chip memory and the on-chip cache of at least one of the processor chips. In some embodiments, the multi-processor system may further include a directory subsystem configured to separate the off-chip memory data and the directory information on to two different off-chip memories. In some embodiments, the multi-processor system may further include a directory subsystem configured with some of the subsystem implemented on a high performance chip which is part of the 3D DRAM memory stack. In some embodiments, the multi-processor system may further include a directory subsystem configured to support varying numbers of sharers per memory block. In some embodiments, the multi-processor system may further include a directory subsystem configured to support varying numbers of sharers per memory block using caching. In some embodiments, the multi-processor system may further include a directory subsystem configured to support varying numbers of sharers per memory block using hashing to entries with storage for different numbers of pointers to sharers. In some embodiments, the multi-processor system may further include a directory subsystem configured to use hashing to reduce storage allocated to memory blocks with zero sharers.

In one example implementation, a multi-processor system may include a plurality of processor chips each of which includes at least one I/O component which is designed to directly connect to photonic components. Each or at least one of the processor chips may be liquid cooled. In some embodiments, the multi-processor system may further include a cooling mechanism and a liquid coolant contained in the cooling mechanism. The liquid coolant may be in direct contact with a back side of a processor die of at least one of the processor chips. In some embodiments, the liquid coolant may change phase to a vapor as part of a heat transfer process. In some embodiments, the vaporized liquid coolant may be condensed by a heat exchanger of the cooling mechanism containing a secondary fluid. In some embodiments, the secondary fluid may be of a different type than the liquid coolant. In some embodiments, a heat flux from the processor die of at least one of the processor chips may be enhanced by impingement. For instance, the liquid coolant may be impinged on the back side of a processor die of at least one of the processor chips.

In one example implementation, a multi-processor system may include a plurality of photonic components and a plurality of processor chips each of which includes at least one I/O component which is designed to directly connect to the photonic components. Each of the processor chips may also include a voltage regulation circuit configured to regulate a voltage of one or more of the processor chips. In some embodiments, the voltage regulation circuit of each of the processor chips may provide one or more voltage domains of the respective processor chip. In some embodiments, the multi-processor system may further include one or more additional electronic components, e.g., inductors, as part of the package.

In one example implementation, a multi-processor system may include a plurality of processor chips each of which includes at least one I/O component which is designed to directly connect to photonic components. The processor chips may be packaged so a total latency from any one of the processor chips to data at any global memory location may not be dominated by a round trip speed-of-light propagation delay. In some embodiments, the multi-processor system may include at least 10,000 processor chips and may be packaged into a total volume of no more than 8 $m^3$. In some embodiments, a density of the processor chips may be greater than 1,000 chips per cubic meter. In some embodiments, a latency of the multi-processor system, having more than 1,000 processor chips, may be less than 200 nanoseconds (ns).

In one example implementation, a multi-processor system may include an inter-processor interconnect (IPI) and a plurality of processor chips. The processor chips are configured to communicate data to one another through the IPI. Each of the processor chips may include one or more cores and one or more level 1 (L1) caches. Each of the L1 caches may be associated with a respective core through a respective core-cache bandwidth. Each of the processor chips may also include at least one memory controller and one or more local memory devices. Each of the local memory devices may be associated with the at least one memory controller through a respective local memory bandwidth. Each of the processor chips may further include an on-chip interconnect (OCI) that is associated with the one or more cores and the at least one memory controller of that processor chip. The OCI is also associated with the IPI of the multi-processor system. The association between the OCI and the plurality of cores of that processor chip is through a bandwidth that is greater than 50% of an aggregate core bandwidth, which is approximately the sum of each core-cache bandwidth of that processor chip. The association between the OCI and the at least one memory controller of that processor chip is through a bandwidth that is greater than 50% of an aggregate memory bandwidth, which is approximately the sum of each local memory bandwidth of that processor chip. The association between the OCI and the IPI of the multi-processor system is through an injection bandwidth. In some embodiment, the injection bandwidth is greater than 50% of the aggregate core bandwidth of that processor chip. In some embodiment, the injection bandwidth is greater than 50% of a sum of the aggregate core bandwidth and the aggregate memory bandwidth of that processor chip.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A multi-processor system, comprising:
   a plurality of processor chips, each of the processor chips comprising:
   a cache; and
   at least one input/output (I/O) component;
   a plurality of photonic components; and
   an off-chip memory shared by more than one of the processor chips,
   wherein the at least one I/O component of at least one of the processor chips is directly connected to one or more of the photonic components to communicate with one or more others of the processor chips, and
   wherein the at least one I/O component of the at least one of the processor chips is configured to use a directory-based cache-coherence protocol.

2. The multi-processor system of claim 1, wherein a directory cache of at least one of the processor chips is configured to store directory information.

3. The multi-processor system of claim 1, wherein the off-chip memory is configured to store directory information.

4. The multi-processor system of claim 3, wherein the off-chip memory comprises a dynamic random access memory (DRAM).

5. The multi-processor system of claim 3, wherein the off-chip memory is configured to store directory information for a memory location, and wherein another off-chip memory is configured to store data for the memory location.

6. The multi-processor system of claim 3, wherein the off-chip memory comprises a three-dimensional dynamic random access memory (3D DRAM).

7. The multi-processor system of claim 3, wherein the off-chip memory comprises a three-dimensional dynamic random access memory (3D DRAM) with a portion of a directory subsystem implemented in a high performance chip included in a stack.

8. The multi-processor system of claim 1, wherein directory information is stored in both the off-chip memory and a directory cache of at least one of the processor chips.

9. The multi-processor system of claim 1, further comprising:
a directory subsystem configured to support varying numbers of sharers per memory block.

10. The multi-processor system of claim 9, wherein the directory subsystem is configured to support varying numbers of sharers per memory block using caching.

11. The multi-processor system of claim 9, wherein the directory subsystem is configured to support varying numbers of sharers per memory block using hashing to entries with storage for different numbers of pointers to the sharers.

12. The multi-processor system of claim 9, wherein the directory subsystem is configured to use hashing to reduce storage allocated to memory blocks with zero sharers.

13. A multi-processor system, comprising:
a plurality of processor chips, each of the processor chips comprising at least one input/output (I/O) component; and
a plurality of photonic components,
wherein the at least one I/O component of at least one of the processor chips is directly connected to one or more of the photonic components, and
wherein the processor chips are packaged so that a total latency from any one of the processor chips to data at any global memory location is not dominated by a round trip speed-of-light propagation delay.

14. The multi-processor system of claim 13, wherein the plurality of processor chips comprises at least 10,000 processor chips, and wherein the processor chips are packaged into a total volume of no more than 8 m$^3$.

15. The multi-processor system of claim 13, wherein a density of the processor chips is greater than 1,000 chips per cubic meter.

16. The multi-processor system of claim 13, wherein the plurality of processor chips comprises at least 1,000 processor chips, and wherein a latency of the multi-processor system is less than 200 nanoseconds.

* * * * *